US009407209B2

(12) United States Patent
Ba

(10) Patent No.: US 9,407,209 B2
(45) Date of Patent: Aug. 2, 2016

(54) HARMONICS CANCELLATION CIRCUIT FOR A POWER AMPLIFIER

(71) Applicant: Stichting IMEC Nederland, Eindhoven (NL)

(72) Inventor: Ao Ba, Maarssen (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 14/566,505

(22) Filed: Dec. 10, 2014

(65) Prior Publication Data

US 2015/0162878 A1 Jun. 11, 2015

(30) Foreign Application Priority Data

Dec. 10, 2013 (EP) .................................... 13196361

(51) Int. Cl.
*H03F 3/217* (2006.01)
*H03F 1/02* (2006.01)

(52) U.S. Cl.
CPC .............. *H03F 1/0233* (2013.01); *H03F 3/217* (2013.01); *H03F 2200/165* (2013.01); *H03F 2200/451* (2013.01)

(58) Field of Classification Search
CPC ................................ H03F 3/217; H03F 3/2171
USPC .............................................. 330/207 A, 251
See application file for complete search history.

(56) References Cited

U.S. PATENT DOCUMENTS

| 5,712,593 | A | 1/1998 | Buer et al. |
| 5,990,712 | A | 11/1999 | Corman et al. |
| 6,731,915 | B1 | 5/2004 | Tran et al. |
| 7,319,763 | B2 * | 1/2008 | Bank ..................... H03F 3/181 330/10 |
| 2009/0146754 | A1 | 6/2009 | Bryant |
| 2009/0238258 | A1 | 9/2009 | Sjoland |
| 2015/0109056 | A1 * | 4/2015 | Lesso ................... H03F 1/0211 330/251 |
| 2016/0065158 | A1 * | 3/2016 | Lesso ...................... H03F 1/34 330/251 |

FOREIGN PATENT DOCUMENTS

WO 2008/043098 A2 4/2008

OTHER PUBLICATIONS

European Search Report, European Patent Application No. 13196361.3, dated Apr. 14, 2014.

(Continued)

*Primary Examiner* — Steven J Mottola
(74) *Attorney, Agent, or Firm* — McDonnell Boehnen Hulbert & Berghoff LLP

(57) ABSTRACT

The present disclosure relates to a circuit that includes an input port for applying a sinusoidal input signal, and a first buffering means for converting the sinusoidal input signal into a square wave signal. A DC level of the square wave signal may be defined by an adjustable threshold voltage level. The circuit also includes an output port for outputting the square wave signal to a power amplifier. Further, the circuit includes a feedback loop having a low pass filtering means arranged for filtering the square wave signal and comparing means arranged for comparing a DC level of a filtered signal received from the low pass filtering means with a pre-set reference level. The reference level may be selected for cancelling a given harmonic component. The comparing means is further arranged for outputting to the first buffering means a correction signal for adjusting the threshold voltage level of the first buffering means.

16 Claims, 4 Drawing Sheets

(56) References Cited

OTHER PUBLICATIONS

Nielsen, Michael et al., "A 2-GHz GaAs HBT RF Pulsewidth Modulator", IEEE Transaction on Microwave Theory and Techniques, vol. 56, No. 2, Feb. 2008, pp. 300-304.

Park, Jung-Dong et al., "Theory and Design of N-Push BJT Clamping Harmonic Generator for Silicon Terahertz ICs", IEEE Microwave and Wireless Components Letters, vol. 22, No. 12, Dec. 2012, pp. 639-641.

Mazor, Nadav et al., "Analysis and Design of an X-Band-to-W-Band CMOS Active Multiplier With Improved Harmonic Rejection", IEEE Transactions on Microwave Theory and Techniques, vol. 61, No. 5, May 2013, pp. 1924-1933.

* cited by examiner

HARMONICS CANCELLATION CIRCUIT FOR A POWER AMPLIFIER

CROSS-REFERENCE TO RELATED APPLICATION

This application claims priority to European Patent Application No. 13196361.3 filed on Dec. 10, 2013, the contents of which are hereby incorporated by reference.

TECHNICAL FIELD

The present disclosure is generally related to the field of non-linear electronic devices like power amplifiers wherein harmonic components substantially affect the performance. More particularly, the disclosure relates to circuits for reducing or cancelling effects of such harmonic components.

BACKGROUND

Switching mode power amplifiers, such as Class-D and Class-E amplifiers, are widely used nowadays due to their high efficiency. However, as highly non-linear devices, switching mode power amplifiers also generate quite a high amount of energy at harmonic frequencies. Especially when using amplifiers with a single-ended output, the even-order harmonic tones are not cancelled out, as opposed to the amplifiers with an ideally differential output. The unwanted tones at the harmonic frequencies then violate the out-of-band spurious emission limits as defined by the ETSI or FCC standard regulation bodies.

Electronic amplifiers are typically classified into classes, e.g. Class-A, B, C, D, E, or even F. They can be grouped into two categories: linear amplifiers like Class-A, B, C and switching mode amplifiers like Class-D, E, F. The active element in a linear amplifier operates in the linear region, which means that the output signal is proportional to the input signal. A sinusoidal input signal results in a sinusoidal output with a larger amplitude. Switching mode amplifiers adopt a different operation principle. Normally, their input signal is a square wave to overdrive the active element. In this case the active element works like a switch, such that it is either completely on for conducting current or completely off. The output signal is then no longer proportional to the input signal. Notwithstanding the difference in operation principle, a conduction angle can be defined for these two categories in almost the same way. The conduction angle of an amplifier depends on the proportion of time during which the active element conducts current. For linear amplifiers the active element operates in the linear region when it is conducting and the output is proportional to the input. For switching amplifiers the active element works like a switch when conducting and the output is not proportional to the input. In the description below the conduction angle is referred to as $2\alpha$, so $\alpha$ represents half of the conduction angle (i.e. $\alpha$ ranges from 0 to $\pi$). If Class-A, the active element is always conducting, the conduction angle is $2\pi$, and thus $\alpha$ equals $\pi$. If Class-B, the active element is conducting for only half of each cycle of the input signal, the conduction angle is $\pi$, and consequently $\alpha$ equals $\pi/2$. For switching mode amplifiers, the input signal is a square wave and the conduction angle is also equivalent to the duty cycle of the input square wave. If the duty cycle is 50%, the input voltage is high during half the period of each cycle and the active element conducts, so the conduction angle is $\pi$, and $\alpha$ equals $\pi/2$.

The conduction angle of a switching mode amplifier is closely related to its harmonics emission performance. For an ideal switching mode amplifier with a broadband resistive load as shown in FIG. 1, the relationship between conduction angle and output power is illustrated in FIG. 2. As explained above, the conduction angle $2\alpha$ means the period during which the switch is closed. Hence, $\alpha$ equals $\pi/2$, meaning that the switch is closed half of the time during the period of the input signal.

It is clear that the $2^{nd}$ harmonic output power is zero when $\alpha$ is $\pi/2$, and the $3^{rd}$ harmonic power becomes zero if $\alpha$ is $\pi/3$ or $2\pi/3$. So if the conduction angle of the amplifier is well controlled, certain harmonic tones can be minimized. However, the real conduction angle of a practical amplifier is difficult to measure. For example, an amplifier for a WiFi system needs to work at 2.4 GHz. The period of a 2.4 GHz signal is 417 picoseconds. A conduction angle of $\pi$ means the conduction time of the active element in the amplifier is only 208.5 picoseconds in each cycle. Directly measuring such a short time duration is extremely challenging.

One way to solve the harmonics emission problem would be to add an extra band-pass filter at the output of the amplifier to filter out any unwanted harmonics. However, such filter has to operate at radio frequencies (RF). High-performance RF band-pass filters are normally made of quartz or ceramics, which makes them difficult to be integrated with a power amplifier manufactured by modern semiconductor technology. Additionally, it introduces extra power loss. Another possible way would be to use a differential output topology to cancel out the even-order harmonics. However, due to poor matching of the two differential branches, the suppression effect is limited.

U.S. Pat. No. 5,712,593 aims at maximizing efficiency while maintaining an allowable distortion level over the entire dynamic range of the power amplifiers. FIG. 3 shows the block diagram of the disclosed circuit. Sampler 14 samples the output signal from amplifier 12 and provides the sampled signal to filter 16. Filter 16 filters out the desired signal and only passes through the undesired signals (harmonics or spurs) to detector 18. Detector 18 converts the filtered output signal to a DC signal proportional to the power level of the filtered output signal. Bias control portion 20 compares the DC signal provided by power detector 18 to a reference signal to produce a control signal. The control signal controls the saturation characteristics of power amplifier portion 12. Such a control loop continually re-biases the power amplifier for maximum efficiency for a desired level of distortion.

The scheme of FIG. 3 can however only be used for linear amplifiers. The active device in power amplifier 12 must be in its linear region, so that the bias condition can be controlled by the feedback loop to change its linearity. A band reject filter 16 is needed to capture the non-linearity of the output signal by selecting the unwanted signals to be suppressed. It selects the unwanted signals that shall be suppressed, and its frequency response determines the cancellation performance of the system. After this, detector 18 is needed to convert the RF signal from filter 16 to a readable DC signal. The presence of band reject filter 16 and detector 18 limits the flexibility of the proposed solution. First, the harmonic cancellation of the systems depends on the frequency response of the BPF, as it determines how well the unwanted signal is being filtered. Secondly, the value of the reference voltage depends on (i) the required distortion level as defined by the user and (ii) on the voltage transfer function (VTC) of detector 18, which makes the selection of the reference voltage technology dependent. Thus, selecting a proper reference voltage is not straightforward and requires complex calculation.

Hence, there is a need for a solution where the conduction angle can be controlled without undue burden, so that the influence a harmonic component can be reduced by adjusting the conduction angle.

SUMMARY

It is an object of embodiments of the present disclosure to provide for a circuit that reduces the effect of a given harmonic component on a power amplifier connected to the circuit.

The above objective is accomplished by the solution according to the present disclosure.

In a first aspect, the disclosure relates to a circuit that includes an input port for applying a sinusoidal input signal, and a first buffering means for converting the sinusoidal input signal into a square wave signal. In one example, a DC level of the square wave signal is defined by an adjustable threshold voltage level. The circuit also includes an output port for outputting the square wave signal to a power amplifier. Further, the circuit includes a feedback loop comprising a low pass filtering means arranged for filtering the square wave signal, and comparing means arranged for comparing a DC level of a filtered signal received from the low pass filtering means with a pre-set reference level. The reference level may be selected for cancelling a given harmonic component. The comparing means is further arranged for outputting to the first buffering means a correction signal for adjusting the threshold voltage level of the first buffering means.

The proposed circuit helps to avoid the occurrence of a given harmonic component when the signal output by the circuit is applied to a power amplifier. The buffering means converts the applied sinusoidal signal into a square wave. The DC level of this square wave signal forms an indication of the conduction angle of the power amplifier (e.g. the duty cycle of the square wave). According to the present disclosure the square wave signal is applied to a low pass filter in a feedback loop. This low pass filter filters out all the high frequency components of the output signal from the buffer, and lets the DC component pass through, in the sense that the filter output signal contains DC information of the input signal for the power amplifier. The measured DC level is compared to a voltage reference signal with a known level that is chosen for cancelling a given harmonic component, typically the second harmonic frequency. Depending on the comparison result a correction signal is output to the buffering means to use for adjusting the threshold voltage, such that the DC level (and consequently the conduction angle) is adapted to bring the DC component of the square wave to a value whereby the influence of the given harmonic component can be eliminated.

In an embodiment, the circuit further comprises a second buffering means arranged for buffering the square wave signal received from the first buffering means and for outputting the buffered square wave signal via the output port. The second buffer is particularly useful for providing additional driving ability to drive the power amplifier.

In an embodiment, the circuit has a single-ended topology.

In an embodiment, the given harmonic component is an even order harmonic component, such as the second harmonic frequency.

For purposes of summarizing the present disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

DESCRIPTION OF THE DRAWINGS

The present disclosure will now be described further, by way of example, with reference to the accompanying drawings, wherein like reference numerals generally refer to like elements in the various figures.

DETAILED DESCRIPTION

Figure 1:
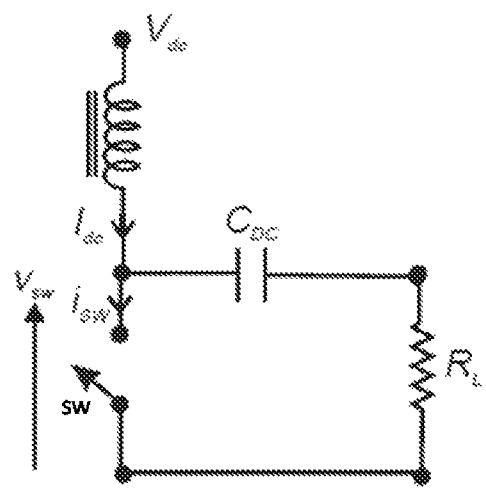
FIG. 1 illustrates an ideal switching mode amplifier.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the description and claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary or example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Figure 4:
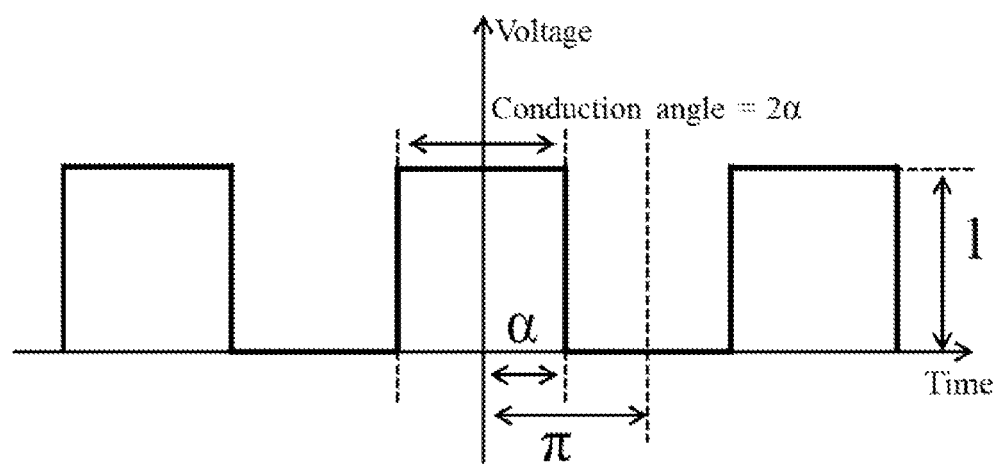
FIG. 4 illustrates a waveform of an input signal to be applied to a switching mode amplifier.

In examples of the present disclosure, the conduction angle is not directly measured as a time duration, but is derived in the voltage domain. The input DC voltage of the switching mode amplifier can be an indicator of its real conduction angle. As shown in FIG. 4, the input signal of the amplifier is a square wave with, in this example, an amplitude normalized to 1. The conduction angle is shown as $2\alpha$. Applying Fourier expansion, the input signal can be written as Equation 1:

$$V = \frac{\alpha}{\pi} + \frac{2}{\pi}\left(\sin\alpha\cos\omega t + \frac{\sin 2\alpha}{2}\cos 2\omega t + \frac{\sin 3\alpha}{3}\cos 3\omega t + \ldots \frac{\sin k\alpha}{k}\cos k\omega t\right) \quad (1)$$

where $\omega$ denotes the fundamental frequency. The DC voltage is equal to $\alpha/\pi$.

To further explain the relationship between conduction angle and harmonics, the even-order harmonics are considered as an example. If $\alpha = \pi/2$, all the even-order harmonics are zero, as can easily be seen from Equation (1). However, if the conduction angle is slightly shifted from $\pi$ (e.g., $\alpha$ deviates from $\pi/2$), the amplitudes of even-order harmonics cannot be neglected. With $\beta$ denoting the deviation of $\alpha$ from $\pi/2$, the DC voltage ($\frac{1}{2}+\beta/\pi$) also deviates from $\frac{1}{2}$ and the second order harmonic amplitude ($-2\beta/\pi$) is proportional to the deviation value, as shown in Equation 2:

$$\text{If } \alpha = \beta + \pi/2: \quad V \approx \frac{1}{2} + \frac{\beta}{\pi} + \frac{2}{\pi}\left(\cos\omega t - \beta\cos 2\omega t + \frac{\cos 3\omega t}{3} + \ldots\right) \quad (2)$$

So if the deviation $\beta/\pi$ of the DC voltage is sensed, the value of $\beta$ is known. The real conduction angle $2\alpha$ can be calculated and the conduction angle can be adjusted to make $\beta$ zero and minimize the even-order harmonics.

Figure 2:
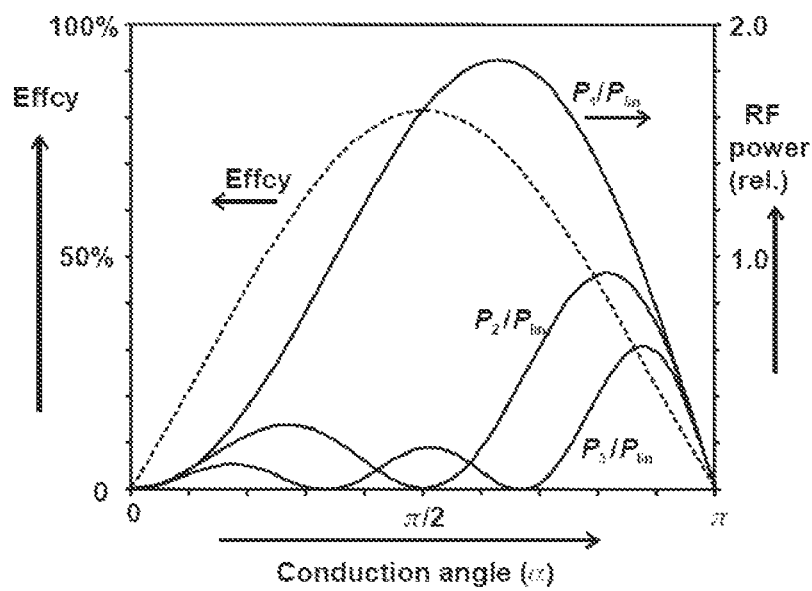
FIG. 2 illustrates the relationship between conduction angle and output power.
Figure 3:
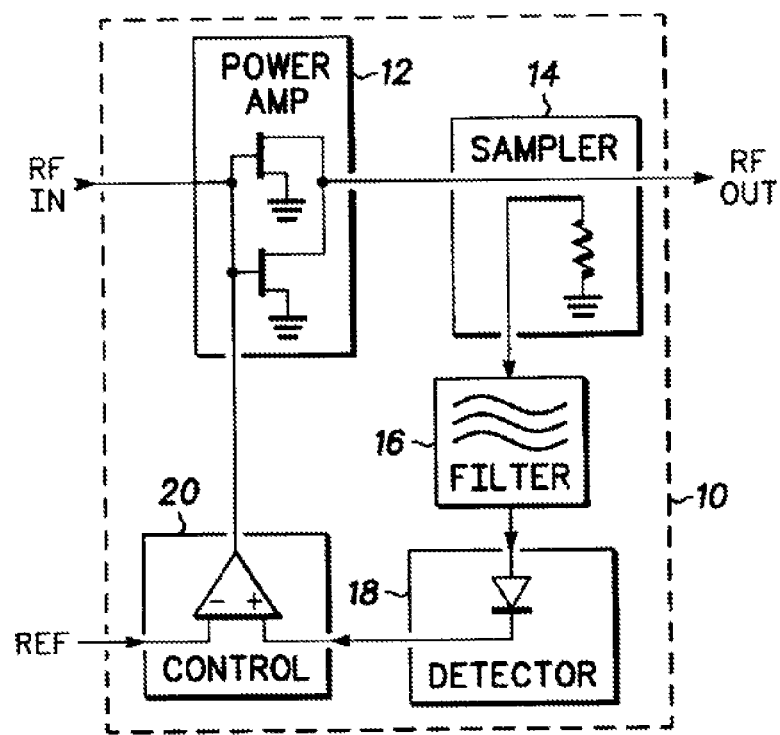
FIG. 3 illustrates a prior art block diagram of the circuit presented in U.S. Pat. No. 5,712,593.
Figure 5:
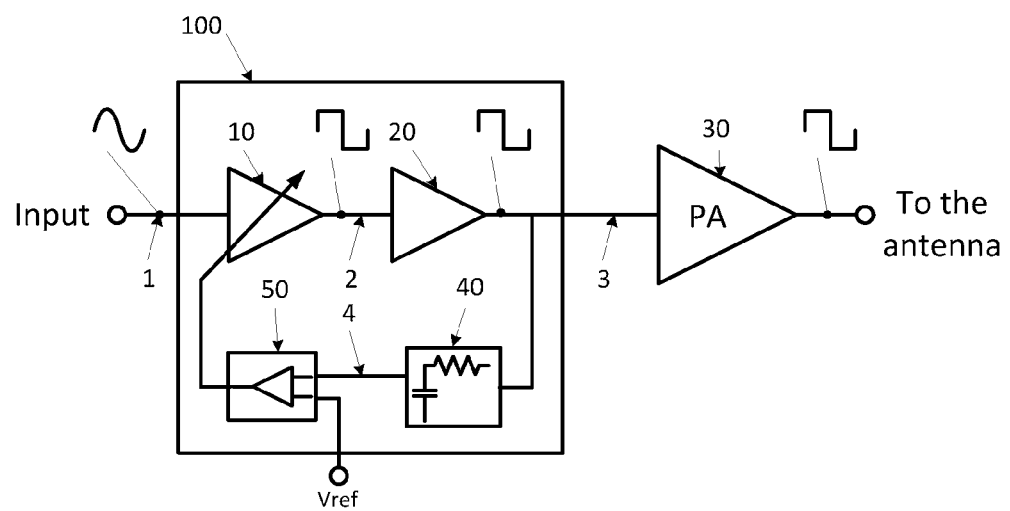
FIG. 5 illustrates a scheme comprising an embodiment of the circuit according to the present disclosure.

FIG. 5 shows a scheme comprising the circuit 100 according to the present disclosure. There are two buffers from the input port to the power amplifier 30 (PA). The first buffer 10 converts the sinusoidal wave into a square wave. The second one (20) is optional and provides strong driving ability to drive the following stage. The output of the PA 30 may be connected to an antenna via a matching network which acts as a conventional impedance transfer block. The matching network does not affect the calibration as it is outside the feedback loop. The input signal of the PA 30, i.e. the signal output by the buffering means, is sensed by a low-pass filter (LPF) 40. The LPF can be implemented as a simple passive first-order RC filter, the requirement is much relaxed compared to the band reject filter 16 in the prior art solution of FIG. 3. The LPF output 4 contains the DC information of the signal 3 that is inputted to the low pass filter. Comparator 50 then compares this DC voltage to a reference voltage Vref. As can be seen from Equations (1) and (2), the DC term of the PA input voltage only relates to the conduction angle, so it is technology independent. Hence, the reference voltage which should be the benchmark of this DC voltage, is also technology independent. By changing the reference voltage, the loop changes the conduction angle of the PA and the harmonics emission energy is changed according to FIG. 2. For example, the reference voltage should be equal to $\frac{1}{2}$ for even order harmonics cancellation. The comparison result then indicates whether the real conduction angle is larger or smaller than the optimized value. Based on the comparison result, the threshold voltage (or bias condition) of the buffer can be adjusted to correct the duty cycle of the input signal of the power amplifier. Thus, the LPF 40 and the comparator 50 form a feedback loop which controls the duty cycle of the PA's input signal. Taking the even order harmonics as an example, if $\alpha$ is larger than $\pi/2$ (which means that $\beta$ is positive), the LPF output is a voltage larger than $\frac{1}{2}$. So the comparator returns a logic "high". Using this information, the threshold voltage of the buffer should be decreased by the calibration loop. Then the conduction angle is changed back to $\pi$. Such a calibration loop can continuously run to maintain the harmonic component below a certain level.

The second buffer 20 in FIG. 4 is optional. As the input impedance of the power amplifier is low, driving such a low impedance requires a buffer with strong driving ability and consumes a relatively high amount of energy. In this case, using two cascaded buffers connected in series is more efficient than using one large buffer. Providing this additional buffer is beneficial in that it allows reducing the size of the first buffer and the overall power consumption. To summarize, the first buffer brings the low-input swing to rail-to-rail level and drives the relatively small subsequent buffer which drives the power amplifier.

The scheme of FIG. 5 has, for the sake of simplicity, a single-ended topology. For differential architectures, it can also be separately applied to the two differential branches. For each branch the same calibration loop as used in FIG. 5 is implemented, so the same functionality is achieved. The reference voltage can be set to $\frac{1}{2}$ of the supply voltage to cancel out even-order harmonics if the matching of the two differential branches is poor. While it is set to ⅓ of the supply, the $3^{rd}$ harmonic is minimized.

It is also worth mentioning that the LPF input port can be changed to connect at the power amplifier output, instead of the input of the PA as shown in FIG. 5. However, in practice, the output voltage waveform of the PA is affected by various other non-ideality effects inside the PA. So the PA input signal is much closer to an ideal square wave and it is better to be used as the input signal of the LPF. In general, the configuration in FIG. 5 has better accuracy.

Figure 6:
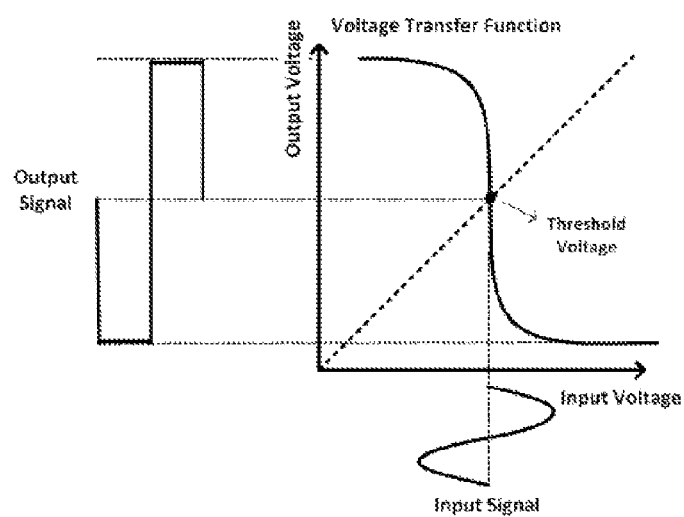
FIG. 6 represents a Voltage Transfer Curve (VTC), which plots the buffer output voltage as a function of its input voltage.
Figure 7:
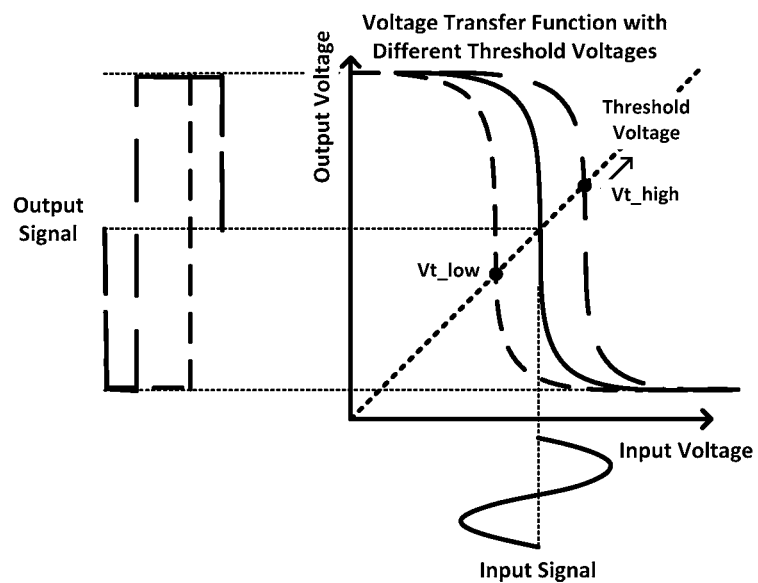
FIG. 7 illustrates the effect of changing the threshold voltage on the output voltage.

The functionality of the buffer is further explained in FIG. 6. The buffer transfers a sinusoidal signal to a square wave. FIG. 6 shows a Voltage Transfer Curve (VTC), which plots the buffer output voltage as a function of its input voltage. The VTC indicates that for a low input voltage, the circuit outputs a high voltage, whereas for high input voltage the output tapers off towards the low level. The threshold voltage is defined as the input voltage that make the output equal to the input. As illustrated in FIG. 7, given the same input signal, the duty cycle of the output signal is larger for a higher threshold voltage $V_{t\_high}$. If the threshold voltage is set as $V_{t\_low}$, then the duty cycle of the output signal is reduced. By changing the threshold voltage of the buffer, the duty cycle of the PA input signal is modified, hence the conduction angle of the PA is equivalently changed.

Figure 8:
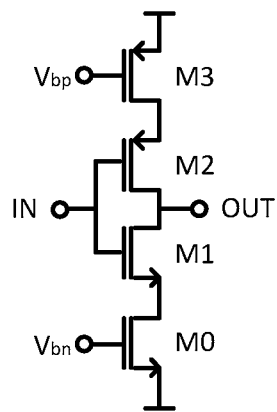
FIG. 8 illustrates an implementation of the tuneable buffer circuit allowing for control of the threshold voltage.

There are several possible ways to control the threshold voltage of the buffer 10, such as changing the bias current. Typically, a buffer circuit is implemented by connecting in parallel a plurality of identical unit buffer circuits. As shown in FIG. 8, a unit buffer circuit comprises transistors M1 and M2 forming an inverter circuit, which are connected to power rails GND and VDD via transistors M0 and M3. The threshold voltage of the unit buffer depends on the bias current of the transistors M1 and M2. The bias current of transistor M1 can be controlled by adjusting the gate voltage of M0, while the bias current of transistor M2 is controlled by the gate voltage of M3. The gate voltages of M0 and M3 are shown in FIG. 8 as the $V_{bn}$ and $V_{bp}$ voltages, respectively. By increasing both $V_{bn}$ and $V_{bp}$ voltages, the bias current of M1 is increased, while the bias current of M2 is decreased. In this case, the threshold voltage is set to a lower value. On the opposite side, for a higher threshold voltage, both $V_{bn}$ and $V_{bp}$ should be reduced. In the disclosure both $V_{bn}$ and $V_{bp}$ voltages can be controlled by the comparator to adjust the buffer threshold voltage.

An important advantage of the disclosure is that the proposed control circuit allows for adjusting the conduction angle of a power amplifier for a given harmonic component by simply changing the reference voltage applied at the comparator. It uses a simple passive LPF instead of complex extra RF filters, which are expensive and cause extra power losses. Also, the proposed circuit is easier to implement and integrate with the PA and it is suitable for both single-ended topology and differential PA topologies.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems.

The invention claimed is:

1. A circuit comprising:
   an input port for applying a sinusoidal input signal;
   a first buffering means for converting the sinusoidal input signal into a square wave signal, wherein the square wave signal has a DC level defined by an adjustable threshold voltage level;
   an output port for outputting the square wave signal to a power amplifier; and
   a feedback loop comprising:
      a low pass filtering means arranged for filtering the square wave signal, and
      comparing means arranged for comparing the DC level of a filtered signal received from the low pass filtering means with a pre-set reference level, wherein the reference level is selected for cancelling a given harmonic component, and the comparing means further arranged for outputting to the first buffering means a correction signal for adjusting the threshold voltage level of the first buffering means.

2. The circuit as in claim 1, further comprising a second buffering means arranged for buffering the square wave signal received from the first buffering means and for outputting the buffered square wave signal via the output port.

3. The circuit as in claim 1, having a single-ended topology.

4. The circuit as in claim 1, wherein the given harmonic component is an even order harmonic frequency.

5. The circuit as in claim 2, wherein the first and second buffering means are connected in series.

6. The circuit as in claim 1, wherein the first buffering means includes a first transistor and a second transistor coupled to form an inverter circuit, and a third transistor and a fourth transistor coupled to the inverter circuit.

7. The circuit as in claim 6, wherein the third transistor connects the inverter circuit to a first power rail, and the fourth transistor connects the inverter circuit to a second power rail.

8. The circuit as in claim 1, wherein the low pass filtering means includes a first-order RC filter.

9. A circuit comprising:
   an input port configured to receive a sinusoidal input signal;
   a first buffer circuit configured to convert the sinusoidal input signal into a square wave signal, wherein the square wave signal has a DC level defined by an adjustable threshold voltage level;
   an output port configured to provide the square wave signal to a power amplifier; and
   a feedback loop comprising:
      a low pass filter circuit configured to receive the square wave signal, and
      a comparator component configured to compare an output from the low pass filter circuit with a reference signal, wherein the reference signal is adapted to cancel a given harmonic component, wherein the comparator component is further configured to provide a correction signal to the first buffer circuit in order to adjust the threshold voltage level of the first buffer circuit.

10. The circuit as in claim 9, further comprising a second buffer circuit configured to buffer the square wave signal from the first buffer circuit, and to provide a buffered square wave signal via the output port.

11. The circuit as in claim 10, wherein the first and second buffer circuits are connected in series.

12. The circuit as in claim 9, having a single-ended topology.

13. The circuit as in claim 9, wherein the given harmonic component is an even order harmonic frequency.

14. The circuit as in claim 9, wherein the first buffer circuit includes a first transistor and a second transistor coupled to form an inverter circuit, and a third transistor and a fourth transistor coupled to the inverter circuit.

15. The circuit as in claim 14, wherein the third transistor connects the inverter circuit to a first power rail, and the fourth transistor connects the inverter circuit to a second power rail.

16. The circuit as in claim 1, wherein the low pass filter includes a first-order RC filter.

* * * * *